United States Patent
Kim et al.

(10) Patent No.: US 9,893,816 B2
(45) Date of Patent: Feb. 13, 2018

(54) DYNAMIC BEAM STEERING OPTOELECTRONIC PACKAGES

(71) Applicant: Intel Corporation, Santa Clara, CA (US)

(72) Inventors: Woosung Kim, Mountain View, CA (US); Myung Jin Yim, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 134 days.

(21) Appl. No.: 15/081,813

(22) Filed: Mar. 25, 2016

(65) Prior Publication Data
US 2017/0279537 A1    Sep. 28, 2017

(51) Int. Cl.
*H04B 10/572* (2013.01)
*H04B 10/079* (2013.01)
(Continued)

(52) U.S. Cl.
CPC .......... *H04B 10/572* (2013.01); *G02B 6/124* (2013.01); *G02B 6/12004* (2013.01);
(Continued)

(58) Field of Classification Search
CPC   H04B 10/572; H04B 10/0795; H04B 10/691; H04B 10/00; G02B 6/12004;
(Continued)

(56) References Cited

U.S. PATENT DOCUMENTS 5,173,915 A * 12/1992 Kubota ................ H01S 3/1055
                                                 372/50.11
6,084,992 A    7/2000 Weber et al.
(Continued)

FOREIGN PATENT DOCUMENTS

KR    1020000053301 A    8/2000

OTHER PUBLICATIONS

International Search Report and Written Opinion dated May 15, 2017 for International Application No. PCT/US2017/018592, 15 pages.
(Continued)

*Primary Examiner* — Ted Wang
(74) *Attorney, Agent, or Firm* — Schwabe, Williamson & Wyatt, P.C.

(57) ABSTRACT

Apparatuses including integrated circuit (IC) optical assemblies and processes for operation of IC optical assemblies are disclosed herein. In some embodiments, the IC optical assemblies include a transmitter component to provide light output having a particular beam direction, and a transmitter driver component. The transmitter component includes a light source optically coupled to a plurality of waveguides, a plurality of gratings, and a plurality of phase tuners. The transmitter driver component causes a light provided by the light source to be centered at a particular wavelength and a particular phase to be induced by each phase tuner of the plurality of phase tuners on a respective waveguide of the plurality of waveguides, in accordance with a feedback signal, to generate the light output having the particular beam direction.

20 Claims, 9 Drawing Sheets

(51) Int. Cl.
    *H04B 10/69* (2013.01)
    *G02B 6/12* (2006.01)
    *G02B 6/124* (2006.01)
    *G02F 1/015* (2006.01)
    *G02B 6/122* (2006.01)
    *H01S 5/30* (2006.01)

(52) U.S. Cl.
    CPC ........... *G02B 6/1221* (2013.01); *G02F 1/015* (2013.01); *H01S 5/3013* (2013.01); *H04B 10/0795* (2013.01); *H04B 10/691* (2013.01); *G02B 2006/12123* (2013.01); *G02B 2006/12142* (2013.01); *G02F 2001/0151* (2013.01)

(58) Field of Classification Search
    CPC .......... G02B 6/124; G02B 2006/12142; G02B 6/1221; G02B 2006/12123; G02F 1/015; G02F 201/0151; H04J 14/0227
    See application file for complete search history.

(56) References Cited

U.S. PATENT DOCUMENTS

| | | | |
|---|---|---|---|
| 2003/0044118 A1* | 3/2003 | Zhou | G02B 6/1228 385/43 |
| 2004/0067006 A1 | 4/2004 | Welch et al. | |
| 2006/0091305 A1 | 5/2006 | Grunnet-Jepsen et al. | |
| 2012/0087613 A1 | 4/2012 | Rasras | |
| 2016/0356956 A1* | 12/2016 | Davoine | G01N 21/7743 |

OTHER PUBLICATIONS

Scott R. Davis et al., "Liquid Crystal Waveguides: New Devices Enabled by >1000 Waves of Optical Phase Control", Proc. of SPIE, vol. 7618, (2010), 14 pages.

J.K. Doylend et al., "Two-dimensional free-space beam steering with an optical phased array on silicon-on-insulator", Optics Express, vol. 19, No. 22, Oct. 24, 2011, pp. 21595-21604.

G. Roelkens et al., "III-V/Si photonics by die-to-wafer bonding", Materials Today, vol. 10, No. 7-8, Jul.-Aug. 2007, pp. 36-43.

J.C. Hulme et al., "Fully integrated hybrid silicon free-space beam steering source with 32 channel phased array", Proc. of SPIE, vol. 8989, (2014), 15 pages.

Harish Subbaraman et al., "Recent advances in silicon-based passive and active optical interconnects", Optics Express, vol. 23, No. 3, Feb. 9, 2015, pp. 2487.

J.K. Doylend et al., "Free-space beam steering using silicon waveguide surface gratings", IEEE Photonic Society 24th Annual Meeting, Oct. 2011, pp. 547-548.

Ami Yaacobi et al., "Integrated phased array for wide-angle beam steering", Optics Letters, vol. 39, No. 15, (2014), pp. 4575-4578.

Karel Van Acoleyen et al., "Two-dimensional optical phased array antenna on silicon-on-insulator", Optics Express vol. 18, No. 13, Jun. 2010, pp. 13655-13660.

* cited by examiner

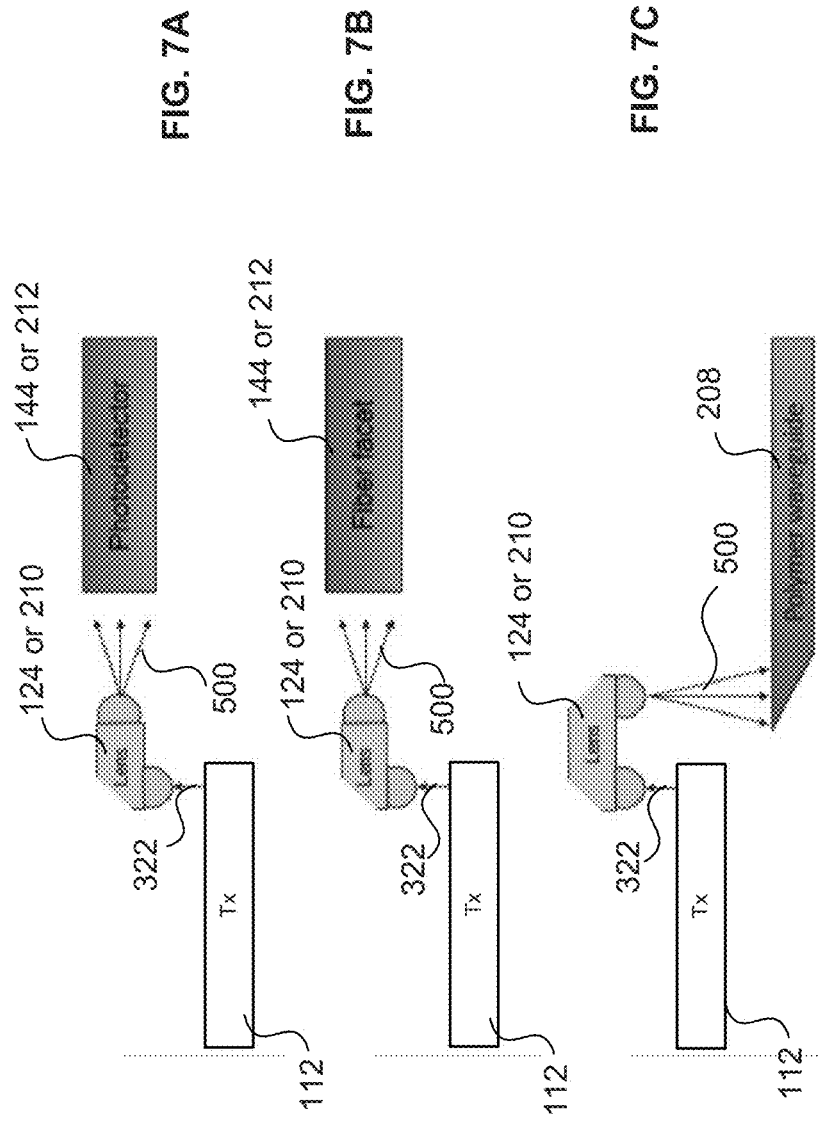

DYNAMIC BEAM STEERING OPTOELECTRONIC PACKAGES

FIELD OF THE INVENTION

The present disclosure relates generally to the technical field of computing, and more particularly, to optoelectronic assemblies and methods for making them.

BACKGROUND

The background description provided herein is for the purpose of generally presenting the context of the disclosure. Unless otherwise indicated herein, the materials described in this section are not prior art to the claims in this application and are not admitted to be prior art or suggestions of the prior art, by inclusion in this section.

Optical data transmission provides increased bandwidth and transfer speed capabilities between and among computers, servers, devices, boards, chips, and components using lower power than may be possible in electrical data transmission. However, fabrication and operation of optoelectronic devices associated with optical data transmission present additional challenges in thermal management, optical alignment, mechanical stability, materials compatibility, operational reliability, component sturdiness, and/or cost effectiveness. As the trend toward higher bandwidth performance and small form factor continues, packaging of optoelectronic devices, such as optical transceiver modules, are further pressed to be compact while addressing higher temperatures, stresses, alignment, cross talk, cost, power delivery, and/or integration challenges arising from their smaller size.

BRIEF DESCRIPTION OF THE DRAWINGS

Embodiments will be readily understood by the following detailed description in conjunction with the accompanying drawings. The concepts described herein are illustrated by way of example and not by way of limitation in the accompanying figures. For simplicity and clarity of illustration, elements illustrated in the figures are not necessarily drawn to scale. Where considered appropriate, like reference labels designate corresponding or analogous elements.

FIGS. 7A-7C depict additional details regarding the optical pathway between the optical transmitter and receiver assemblies, according to some embodiments.

DETAILED DESCRIPTION

Figure 1:
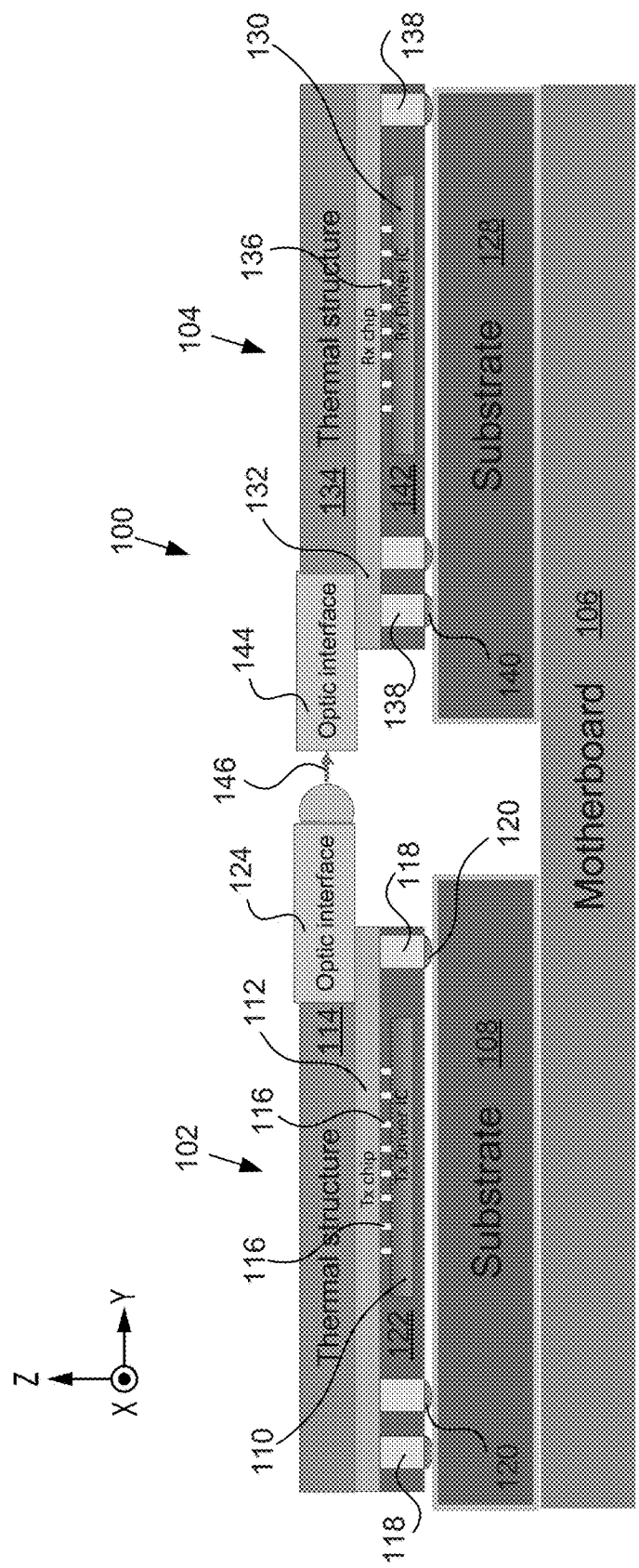
FIG. 1 depicts a cross-sectional view of at least a portion of an example optoelectronic package, according to some embodiments.

Embodiments of apparatuses and methods related to integrated circuit (IC) assemblies are described. In embodiments, an integrated circuit (IC) optical package may include a transmitter component to provide light output having a particular beam direction; and a transmitter driver component electrically coupled to the transmitter component. The transmitter component may include a light source optically coupled to a plurality of waveguides, a waveguide of the plurality of waveguides optically coupled to a respective grating of a plurality of gratings, and a phase tuner of a plurality of phase tuners coupled to a respective waveguide of the plurality of waveguides. The transmitter driver component may cause, in accordance with a feedback signal, a light provided by the light source to be centered at a particular wavelength and a particular phase to be induced by each phase tuner of the plurality of phase tuners on the respective waveguide of the plurality of waveguides to generate the light output having the particular beam direction. These and other aspects of the present disclosure will be more fully described below.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. Additionally, it should be appreciated that items included in a list in the form of "at least one A, B, and C" can mean (A); (B); (C); (A and B); (B and C); (A and C); or (A, B, and C). Similarly, items listed in the form of "at least one of A, B, or C" can mean (A); (B); (C); (A and B); (B and C); (A and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, it may not be included or may be combined with other features.

Optoelectronic assemblies described herein facilitate optical data transfer, for example without limitation, in high performance computing applications, board to board transfers, intra-board transfers, memory to central processing unit (CPU) transfers, chip to chip transfers, component to component transfers, processing applications, storage applications, data access applications, communication applications, and the like. Electrical interconnects over short distances using, for example, copper, may have bandwidth and transfer speed limitations while requiring proportionally increasing power as distance increases. Optical interconnects may provide better bandwidth and transfer speed capabilities. In some embodiments, optoelectronic assemblies, such as optical transceiver modules, may be capable of 50 Gigabits per second (Gbps), 100 Gbps, or greater data transfer speeds.

For example, in integrated circuit (IC) packages including optical assemblies (also referred to as optoelectronic packages or optoelectronic assemblies), in which one or more optical assemblies may be co-packaged near IC chips, both types of interconnects—electrical interconnects and optical interconnects—may coexist. Electrical interconnects may be used to handle electrical signals associated with slower data transfer requirements while optical interconnects may be used to handle optical signals associated with higher data transfer requirements. ICs may be silicon-based and the same silicon-based materials may be used for optical modules. In some embodiments, as described in detail below, silicon may be transparent in infrared wavelengths and light at infrared wavelengths may be guided within silicon due to the high refractive index difference between silicon and surrounding materials, such as silicon dioxide. Such material characteristics may be exploited to facilitate optical assembly construction as well as operation, for instance, to maintain optical alignment between co-packaged optical assemblies.

Small form factor optical assemblies, even when co-packaged together, may have high precision optical coupling requirements. Providing high precision optical coupling, in turn, may be associated with high manufacturing cost. Additionally, even if high precision optical coupling is achieved at the manufacturing stage, optical couplings may become decoupled during the operational stage. Decoupling may occur due to, for example, a coefficient of thermal expansion (CTE) mismatch during operation of the package including the optical assemblies.

Thus, it may be beneficial for an optoelectronic package including at least two optical assemblies (e.g., an optical transmitter assembly and an optical receiver assembly) to provide long-term optical alignment or coupling, adjust to or self-correct for possible optical misalignment(s) over time, have lower optical alignment or coupling tolerance requirements during fabrication or assembly, and/or not incur high manufacturing costs associated with optical alignment or coupling.

FIG. 1 depicts a cross-sectional view of at least a portion of an example optoelectronic package 100, according to some embodiments. Optoelectronic package 100 may include an optical transmitter assembly 102, an optical receiver assembly 104, and a package base 106. Optical transmitter assembly 102 may also be referred to as an optical transmitter module or transmitter module. Optical receiver assembly 104 may also be referred to as an optical receiver module or receiver module. Package base 106 may also be referred to as a printed circuit board (PCB), a motherboard, or a base.

Optical transmitter assembly 102 may be configured to output light along an optical pathway 146 to optical receiver assembly 104, through respective optical interfaces 124 and 144. In some embodiments, package base 106 may include a number of waveguides to provide an alternate optical pathway from optical transmitter assembly 102 to optical receiver assembly 104 (to be illustrated and described more fully below).

In some embodiments, optical transmitter assembly 102 includes one or more structures (e.g., waveguides, gratings, phase tuners, etc.) capable of providing dynamic beam direction steering capabilities so that even if passively aligned (e.g., static or fixed position) optical structures with the optoelectronic package 100 experience misalignment or change, the output light may be reliably directed to the optical receiver assembly 104.

Optical transmitter assembly 102 may comprise a stacked IC and optical structure positioned at a first portion of the package base 106. In some embodiments, optical transmitter assembly 102 may include a substrate 108 disposed above and bonded to the first portion of the package base 106; an optical transmitter driver component 110 disposed between the substrate 108 and an optical transmitter component 112; a thermal structure 114 disposed above the optical transmitter component 112; and the optical interface 124 optically coupled to the optical transmitter component 112.

In some embodiments, the optical transmitter driver component 110 may be disposed above the substrate 108, and be electrically coupled and bonded to the optical transmitter component 112 via a plurality of electrical connectors 116 (e.g., in a flip-chip arrangement). Optical transmitter component 112 may comprise an IC, die, PCB, or chip. Optical transmitter component 112 may also be referred to as a transmitter (Tx), transmitter component, transmitter module, Tx chip, silicon photonics transmitter (STx) die, STx assembly, or the like. In some embodiments, optical transmitter component 112 may comprise a silicon-based component. In some embodiments, optical transmitter component 112 may include dynamic optical alignment mechanisms, as described in detail below.

Optical transmitter driver component 110 may comprise an IC, die, PCB, or chip. Optical transmitter driver component 110 may also be referred to as a transmitter (Tx) IC, transmitter driver, transmitter driver IC, transmitter driver module, transmitter driver die, or the like. Optical transmitter driver component 110 may include, without limitation, circuitry, firmware, and/or software capable of controlling the optical transmitter component 112, preparing data to be transmitted by the optical transmitter component 112, preparing electrical signals for conversion to optical signals for transmission, processing optical alignment feedback signals from the optical receiver assembly 104 and selectively actuating one or more sub-components included in the optical transmitter component 112 (to be described in detail below), and/or otherwise facilitate operation of the optical transmitter component 112.

Thermal structure 114 disposed over the optical transmitter component 112 may comprise one or more layers of thermal dissipation materials, in which any of the layers may be continuous or non-continuous. For example, one or more layers may comprise sheets of metallic or conductive materials. As another example, one or more layers may comprise a plurality of thermal dissipation bumps. In some embodiments, thermal structure 114 may also facilitate mechanical stability, material stress management, and/or provide other benefits to the optical transmitter assembly 102.

A plurality of posts 118 may be disposed between the optical transmitter component 112 and the substrate 108. A plurality of bumps 120 may be disposed between the plurality of posts 118 and the substrate 108, in which each bump of the plurality of bumps 120 may be aligned with a respective post of the plurality of posts 118. In some embodiments, the posts 118 and bumps 120 may facilitate formation of a cavity space below the optical transmitter component 112 in which the optical transmitter driver component 110 may reside. Posts 118 and bumps 120 may also facilitate thermal dissipation, mechanical stability, mechanical stress management, reduce cross talk, and/or the like associated with the optical transmitter assembly 102.

In some embodiments, all or substantially all the space between the optical transmitter component 112 and substrate 108 that is not occupied by the posts 118, bumps 120, optical transmitter driver component 110, and electrical connectors 116 may be occupied by a passivation layer 122. Passivation layer 122 may comprise a polymer material or a dielectric material.

An input or receiving area of the optical interface 124 (also referred to as an optic interface) may be optically coupled to an output area of the optical transmitter component 112. Optical interface 124 may include one or more optical components to facilitate beam shaping and propagation of the light output from the optical transmitter component 112 to the optical receiver assembly 104. Optical interface 124, for instance, may include lenses, mirrors, collimators, and the like.

Optical receiver assembly 104 may comprise a stacked IC and optical structure positioned at a second portion of the package base 106. In some embodiments, optical receiver assembly 104 may include a substrate 128 disposed above and bonded to the second portion of the package base 106; an optical receiver driver component 130 disposed between the substrate 128 and an optical receiver component 132; a thermal structure 134 disposed above the optical receiver component 132; and an optical interface 144 optically coupled to the optical receiver component 132.

In some embodiments, the optical receiver driver component 130 may be disposed above the substrate 128, and be electrically coupled and bonded to the optical receiver component 132 via a plurality of electrical connectors 136 (e.g., in a flip-chip arrangement). Optical receiver component 132 may comprise an IC, die, PCB, or chip. Optical receiver component 132 may also be referred to as a receiver (Rx), receiver component, receiver module, Rx chip, silicon photonics receiver (SRx) die, SRx assembly, or the like. In some embodiments, optical receiver component 132 may comprise a silicon-based component.

Optical receiver driver component 130 may comprise an IC, die, PCB, or chip. Optical receiver driver component 130 may also be referred to as a receiver (Rx) IC, receiver driver, receiver driver IC, receiver driver module, receiver driver die, or the like. Optical receiver driver component 130 may include, without limitation, circuitry, firmware, and/or software capable of controlling the optical receiver component 132, converting received optical signals into electrical signals, analyzing the electrical signals to selectively generate feedback signals (to be described in detail below), and/or otherwise facilitate operation of the optical receiver component 132.

Thermal structure 134 disposed over the optical receiver component 132 may comprise one or more layers of thermal dissipation materials, in which any of the layers may be continuous or non-continuous. For example, one or more layers may comprise sheets of metallic or conductive materials. As another example, one or more layers may comprise a plurality of thermal dissipation bumps. In some embodiments, thermal structure 134 may also facilitate mechanical stability, material stress management, and/or provide other benefits to the optical receiver assembly 104.

A plurality of posts 138 may be disposed between the optical receiver component 132 and the substrate 128. A plurality of bumps 140 may be disposed between the plurality of posts 138 and the substrate 128, in which each bump of the plurality of bumps 140 may be aligned with a respective post of the plurality of posts 138. In some embodiments, the posts 138 and bumps 140 may facilitate formation of a cavity space below the optical receiver component 132 in which the optical receiver driver component 130 may reside. Posts 138 and bumps 140 may also facilitate thermal dissipation, mechanical stability, mechanical stress management, reduce cross talk, and/or the like associated with the optical receiver assembly 104.

In some embodiments, all or substantially all the space between the optical receiver component 132 and substrate 128 that is not occupied by the posts 138, bumps 140, optical receiver driver component 130, and electrical connectors 136 may be occupied by a passivation layer 142. Passivation layer 142 may comprise a polymer material or a dielectric material.

Optical interface 144 (also referred to as an optic interface) may be optically coupled to the optical receiver component 132. Optical interface 144 may include one or more optical components to facilitate receiving light outputted from the optical interface 124. In some embodiments, optical interface 144 may include photodetectors (e.g., photodetector based optical interconnect) or optical fiber couplers (e.g., optical fiber based optical interconnect). Optical interface 144 may additionally include, for example, lenses, mirrors, collimators, and the like. In some embodiments, light outputted from the optical interface 124 may propagate along an optical pathway 146 to the optical interface 144. The separation distance between the optical interfaces 124 and 144, or the length of the optical pathway 146, may be in the range of a few tens of centimeter (cm), such as 20 cm, 30 cm, 40 cm, or the like.

In some embodiments, optoelectronic package 100 may include one or more additional components, structures, or the like. Although not shown, there may be electrical coupling(s) between the optical transmitter assembly 102 and the optical receiver assembly 104 via one or more electrical connections in the package base 106 (in addition to the optical coupling described above). For example, such electrical connection may be used to communicate feedback signals or information associated with optical misalignment from the optical receiver assembly 104 to the optical transmitter assembly 102.

As another example, optoelectronic package 100 may include a power management component, which may include circuitry capable of managing power (e.g., regulate power, provide power, etc.) for the package 100 and/or for one or more of the optical transmitter driver component 110, optical transmitter component 112, optical receiver driver component 130, or optical receiver component 132. As still another example, the optical transmitter assembly 102 may include an underfill layer between the optical transmitter component 112 and the optical transmitter driver component 110 and/or the optical receiver assembly 104 may include an underfill layer between the optical receiver component 132 and the optical receiver driver component 130.

In FIG. 1, both the optical transmitter assembly 102 and optical receiver assembly 104 are provided on the same package base 106. In alternative embodiments, optical transmitter assembly 102 and optical receiver assembly 104 may be provided on separate package bases and/or no package base(s), while still included in the same package together (e.g., co-packaged together). In other embodiments, optical transmitter assembly 102 and optical receiver assembly 104 may be separately packaged from each other (e.g., in separate devices).

Figure 2:
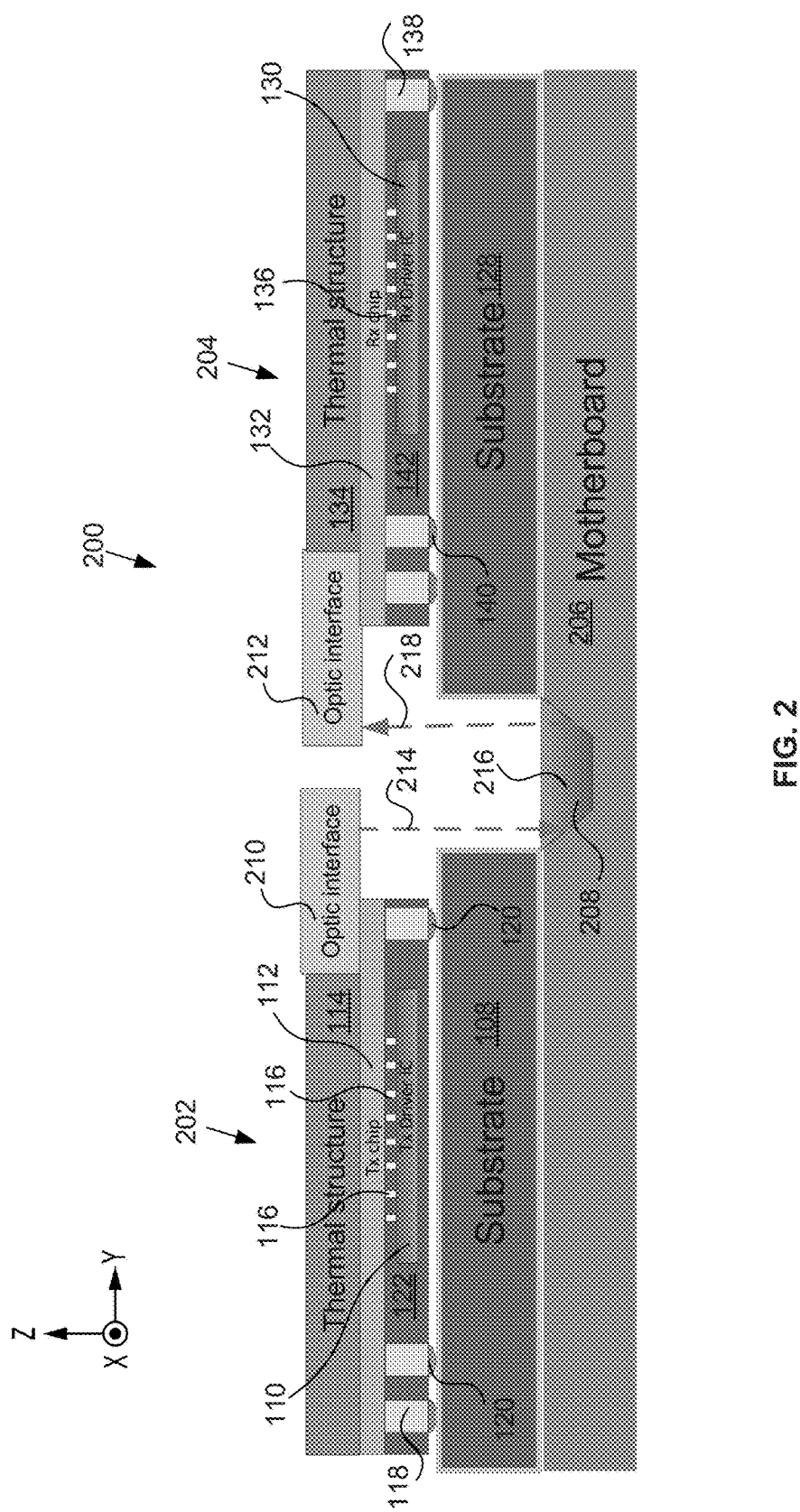
FIG. 2 depicts a cross-sectional view of at least a portion of another example optoelectronic package, according to some embodiments.

FIG. 2 depicts a cross-sectional view of at least a portion of another example optoelectronic package 200, according to some embodiments. Optoelectronic package 200 may include an optical transmitter assembly 202, an optical receiver assembly 204, and a package base 206. Optical transmitter assembly 202 may be similar to optical transmitter assembly 102, except that an optical interface 210 included in the optical transmitter assembly 202 may include component(s) and/or be configured to provide the light output from the optical transmitter component 112 in a different direction than optical interface 124. Likewise, optical receiver assembly 204 may be similar to optical receiver assembly 104, except that an optical interface 212 included in the optical receiver assembly 204 may include component(s) and/or be configured to receive the light output provided by the optical interface 210 in a different direction than optical interface 144.

In some embodiments, the package base 206 includes a waveguide 208, such as a polymer waveguide, aligned with an optical pathway between the optical interfaces 210 and 212. The optical pathway between the optical interfaces 210 and 212 may comprise a first optical pathway 214, a second optical pathway 216, and a third optical pathway 218. The light or beam outputted from the optical interface 210 may propagate along the first optical pathway 214 into the waveguide 208. The light or beam then propagates within the waveguide 208 along the second optical pathway 216. The light or beam exits the waveguide 208 and travels up to an input or receiving area of the optical interface 212 along the third optical pathway 218. The optical coupling between the assemblies 202 and 204 may be referred to as a (polymer) waveguide based optical interconnect configuration.

Figure 3:
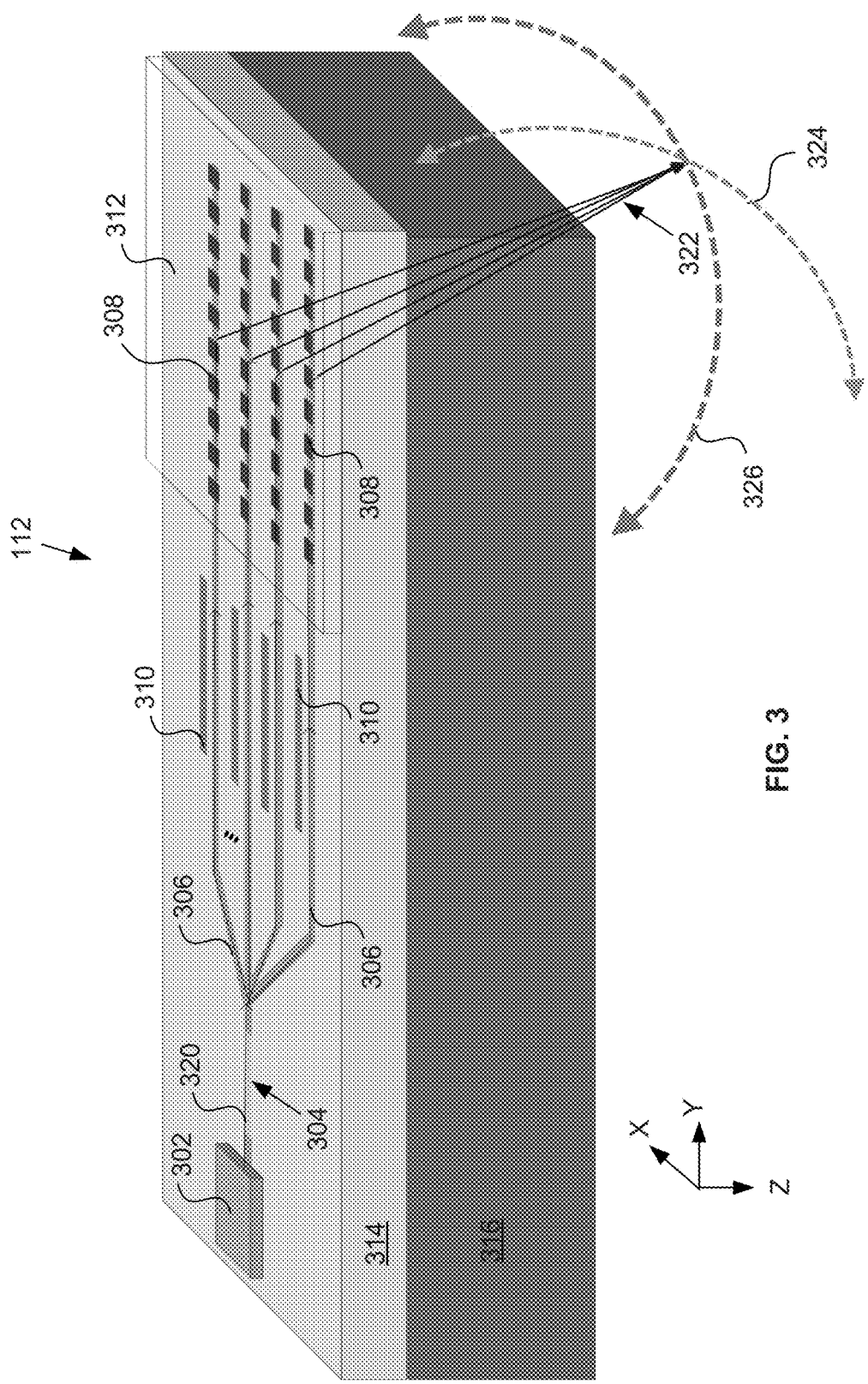
FIG. 3 depicts a perspective view of at least a portion of an optical transmitter component included in the optoelectronic package of FIGS. 1 and 2, according to some embodiments.

FIG. 3 depicts a perspective view of at least a portion of the optical transmitter component 112, according to some embodiments. A plurality of structures may be disposed above an insulator layer 314, and the insulator layer 314 may be disposed above a substrate 316. The insulator layer 314 may comprise silicon dioxide ($SiO_2$), and have a thickness or height of approximately 2 micrometer ($\mu$m) (or less or greater than 2 $\mu$m). The substrate 316 may comprise silicon, and have a thickness or height of approximately 300 $\mu$m (or less or greater than 300 $\mu$m).

The plurality of structures disposed above the insulator layer 314 may include, without limitation, a light source 302, a modulator 304, a plurality of waveguides 306, a plurality of gratings 308, a plurality of phase tuners 310, and a reflective layer 312.

In some embodiments, light source 302 may comprise a laser such as a Group III-V tunable laser. Light source 302 may be fabricated separately and then bonded to the insulator layer 314, such as molecular wafer bonding. Light source 302 may operate in any of a plurality of wavelengths, in a wavelength range of approximately 1200 to 1600 nanometer (nm), have a tuning range of approximately 40 nm with a center wavelength of approximately 1310 nm, have a center wavelength of any of approximately 1200 to 1600 nm, or the like. Light source 302 may operate in the infrared wavelength range. In some embodiments, the operating wavelength of the light source 302 may coincide with the wavelength(s) at which the insulator layer 314 and substrate 316 may be transparent. For example, the light source 302 may lase at approximately 1310 nm and both the insulator layer 314 and substrate 316 may be transparent (or substantially transparent) at approximately 1310 nm. Although not shown, the light source 302 may be controlled or driven by the optical transmitter driver component 110.

The output of the light source 302 may be optically coupled to the input of the modulator 304. Modulator 304 may comprise a high speed optical modulator capable of modulating the light output from the light source 302 into a form suitable for propagation into each waveguide of the plurality of waveguides 306. For example, modulator 304 may split the light output or beam from the light source 302 into the same number as the number of waveguides comprising the plurality of waveguides 306. Modulator 304 may also perform operations such as, but not limited to, changing the frequency, amplitude, and/or polarization of the light output from the light source 302. In some embodiments, modulator 304 may comprise doped silicon material, having a dopant concentration of approximately $10^{17}$ to $10^{20}$ $cm^{-3}$; a thickness or height of approximately 0.2 $\mu$m to 0.4 $\mu$m; and a width (along the x-direction in accordance with a Cartesian coordinate system) of approximately 0.4 $\mu$m to 1 $\mu$m.

The output of the modulator 304 may be optically coupled to the inputs of the plurality of waveguides 306. In some embodiments, the plurality of waveguides 306 (also referred to as a waveguide array) may comprise waveguides arranged parallel to each other. The plurality of waveguides 306 may comprise eight waveguides (or channels), more than eight waveguides, 64 waveguides (or channels), less than 64 waveguides, or more than 64 waveguides. Each waveguide of the plurality of waveguides 306 may comprise silicon material; having a height or thickness in the range of approximately 0.2 to 0.4 $\mu$m; and a width (along the x-direction) in the range of approximately 0.4 to 1.0 $\mu$m depending on the height.

The output of each waveguide may be optically coupled to a respective grating of the plurality of gratings 308. The plurality of gratings 308 may also be referred to as grating emitters. Each of the gratings 308 may comprise a periodic structure having any of a variety of shapes such as, but not limited to, a square, sinusoidal, sawtooth, triangular, or other shape. Each grating may comprise silicon material having a thickness or height of approximately 0.4 $\mu$m, a width of approximately 0.4 $\mu$m, and a periodicity of approximately 0.5 $\mu$m (these dimensions may vary consistent with the dimensions of the plurality of waveguides 306). The plurality of gratings 308 may be configured to cause the light output or beam from each waveguide of the plurality of waveguides 306 to coalesce or combine together to form a single light output beam 322.

Each phase tuner of the plurality of phase tuners 310 may be located adjacent to or on a portion of a respective waveguide of the plurality of waveguides 306. In some embodiments, each phase tuner of the plurality of phase tuners 310 may comprise a metal electrode, heater, or temperature controller; or an electro-optic controller that selectively controls doping concentration in particular regions of the waveguides 306 (e.g., via carrier injection or depletion of at least a particular portion of the waveguide by forward or reverse biasing a portion of the waveguide, selective biasing a portion of the waveguide to induce a particular index of refraction to the outer diameter of the waveguide that is different from the inner diameter, thereby generating a cladding). Each phase tuner of the plurality of phase tuners 310 may be electrically coupled and controlled by the optical transmitter driver component 110.

As described in detail below, each phase tuner may be capable of causing a particular index of refraction change in at least a specific portion of the waveguide, thereby causing the phase delay along the overall length of the waveguide to be of a particular amount. In some embodiments, the amount of index of refraction change induced on each waveguide of the plurality of waveguides 306 may differ from each other at any given time. When the phase delay in respective waveguides differs from each other by a particular amount, the light outputted from respective waveguides may have different phases relative to each other. Hence, each phase tuner of the plurality of phase tuners may be capable of controlling the phase associated with the light traversing the respective waveguide.

The particular phase differences among the light outputs may result in a particular first far field beam steering direction 326 associated with the light output beam 322. First far field beam steering direction 326 may comprise a direction in/out of the y-z plane in accordance with a Cartesian coordinate system (e.g., into or out of the page). The particular wavelength of the light output beam 322 may be associated with a particular second far field beam steering direction 324. Second far field beam steering direction 324 may comprise a direction along or parallel to the y-z plane in accordance with a Cartesian coordinate system. The combination of the first and second far field beam steering directions 326, 324 may define a far field beam steering direction (also referred to as a beam direction or far field beam direction) in three-dimensions (e.g., in the y-z plane and x-z plane in accordance with a Cartesian coordinate system) associated with the light output beam 322.

The output of the plurality of gratings 308 may be reflected by the reflective layer 312 so that the light output beam 322 may traverse the insulator layer 314 and the substrate 316 to exit a side of the substrate 316 that is opposite to the side of the substrate 316 closest to the plurality of structures such as the light source 302. Reflective layer 312 may be disposed above the plurality of gratings 308. In some embodiments, reflective layer 312 may comprise a metal layer or a metal deposition layer, such as, but not limited to, an aluminum/silver/gold (Al/Ag/Au) compound material; and have a thickness or height of approximately 2 μm or thicker.

In some embodiments, the modulator 304, plurality of waveguides 306, plurality of gratings 308, plurality of phase tuners 310, and/or the reflective layer 312 may be formed using photo masking, deposition, etching, and/or curing processes. In some embodiments, the plurality of phase tuners 310 may be separately formed and bonded or coupled to the insulator layer 314 and/or plurality of waveguides 306.

In this manner, light outputted from the light source 302 traverses an optical pathway 320, undergoing one or more optical manipulations as described herein, to be emitted as the light output beam 322 having a particular wavelength (or a particular center wavelength) and a particular far field beam direction (e.g., directions 324 and 326).

Figure 4:
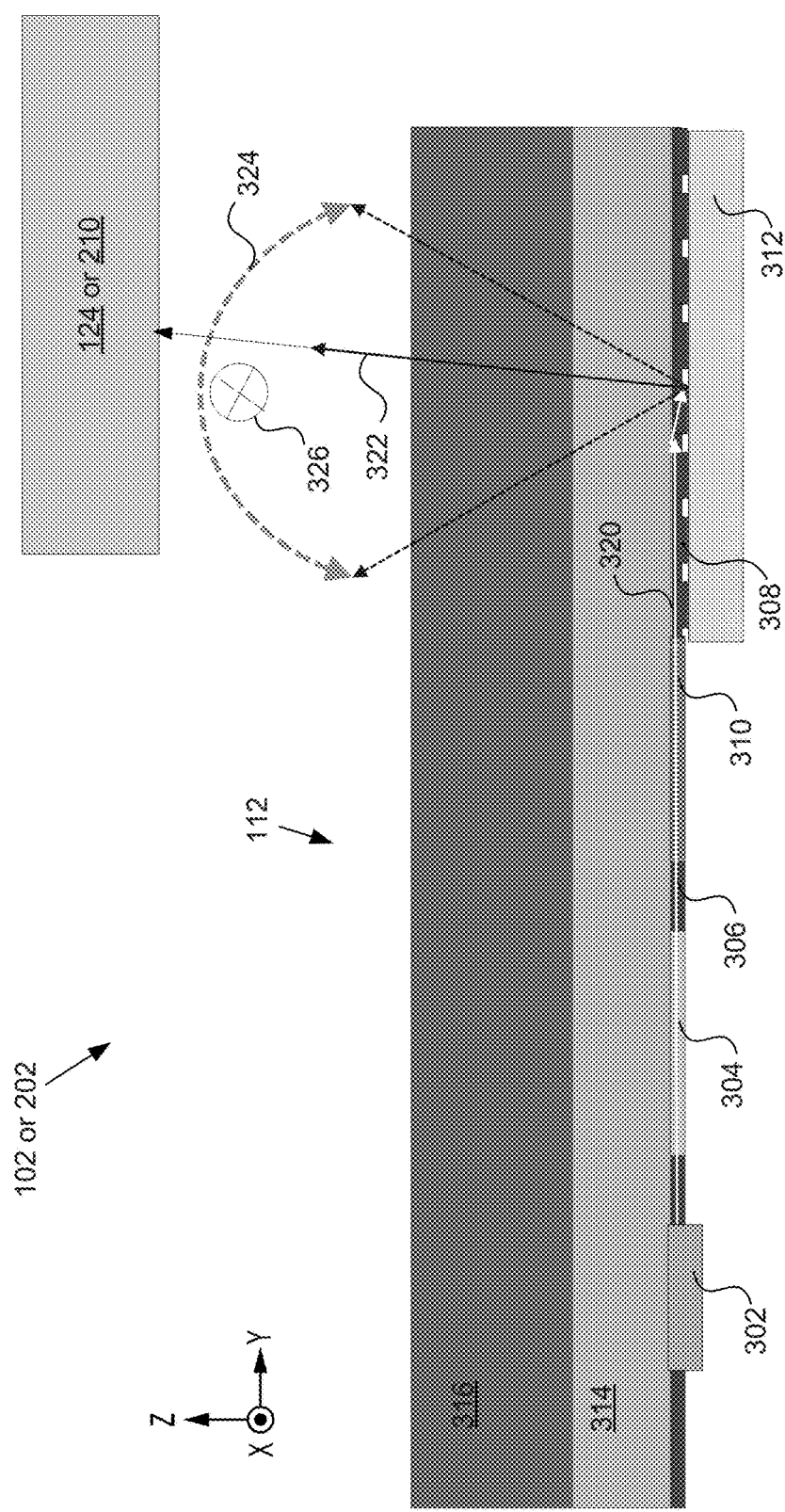
FIG. 4 depicts a cross-sectional view of at least a portion of an optical transmitter assembly included in the optoelectronic package of FIGS. 1 and 2, according to some embodiments.

FIG. 4 depicts a cross-sectional view of at least a portion of the optical transmitter assembly 102 or 202, according to some embodiments. In FIG. 4, the optical transmitter component 112 may be in the same orientation as shown in FIGS. 1 and 2. As described in detail below, the light output beam 322 may be received by the optical interface 124 (in the case of the optoelectronic package 100) or the optical interface 210 (in the case of the optoelectronic package 200). In some embodiments, the (separation) distance between the output area of the optical transmitter component 112 and the input area of the optical interface 124 or 210 may be approximately less than 1 millimeter (mm).

In some embodiments, potential optical misalignment between the optical transmitter assembly 102 and optical receiver assembly 104 (or assemblies 202 and 204 in the case of the optoelectronic package 200) may be actively monitored and, when detected, dynamically compensated for by adjusting or controlling the far field beam direction associated with the light output beam 322. Dynamic beam direction steering may be performed without mechanical movement of optical components (e.g., moving mirrors). Dynamic beam direction steering may also be performed in any of three-dimensions. Optical phase within the waveguide 306, which may be composed of silicon, may be changed by thermally or electro-optically changing the silicon's index of refraction. When the phases of respective waveguides 306 in the plurality of waveguides 306 are changed relative to each other, via proportional changes in their index of refraction, the plurality of gratings 308 may define a particular location in the far field. A wavelength of the light source 302 also defines a particular location in the far field. A wavelength selectable or tunable light source may define a plurality of particular locations in the far field. The phase controlling technique in combination with the wavelength selection technique may result in far field beam direction steering capability in three-dimensional space.

In some embodiments, the first far field beam steering direction 326 (e.g., direction in/out of the y-z plane or in/out of the page) may be controlled in accordance with Equation 1 when the plurality of phase tuners 310 affect the phase associated with respective waveguides via particular temperature control of each of the waveguides 306.

$$\Delta n/\Delta T = 1.8 \times 10^{-4}, \quad \text{(Eq. 1)}$$

where $\Delta n$=change in the refraction index of the silicon waveguide, and $\Delta T$=change in silicon waveguide temperature (temperature in Kelvin (K)). Equation 1 may be referred to as a silicon thermo-optic coefficient equation. The change in phase, in turn, may be a function of the change in the refraction index.

Alternatively, if the plurality of phase tuners 310 affect the phase via electro-optic control (e.g., changing the doping concentration in at least a portion of the waveguides 306 using carrier injection or depletion techniques), then the first far field beam steering direction 326 may be defined in accordance with Equation 2.

$$\Delta n = \Delta n_e + \Delta n_h = -[8.8 \times 10^{-22} \Delta n + 8.5 \times 10^{-18} (\Delta P)^{0.8}], \quad \text{(Eq. 2)}$$

where $\Delta n$=change in the refraction index of silicon waveguide, $\Delta n_e$=change in refraction index associated with electron concentration in silicon waveguide, $\Delta n_h$=change in refraction index associated with hole concentration in silicon waveguide, and ΔP=change in dopant concentration in silicon waveguide. The dopant may comprise a p-type dopant, such as boron, or a n-type dopant, such as phosphorus. Equation 2 may be referred to as a doping dependent silicon refractive index coefficient.

In some embodiments, Equation 2 may also be applicable to generate a cladding region in a portion of the waveguide by inducing an index of refraction change only or mainly in an outer diameter region of the portion of the waveguide. Such cladding region serves to change the propagation length (and hence propagation distance) through a given waveguide, resulting in a particular phase.

In some embodiments, the second far field beam steering direction 324 (e.g., direction along the y-z plane) may be a function of the wavelength λ associated with the light source 302, as defined in Equation 3.

$$\theta = a\sin\left[\frac{\left(\frac{2\pi n_{eff}}{\lambda}\right) - m\frac{2\pi}{\Lambda}}{k}\right], \quad (Eq. 3)$$

where θ=light source wavelength dependent grating emitter output emission angle, wherein the angle is measured from perpendicular to the x-z plane in the y-z plane, $n_{eff}$=effective index of refraction of silicon waveguide, m=grating diffraction order, Λ=grating period, λ=light source wavelength, and k=2π/λ. When the light source 302 comprises a tunable laser which may be tuned to one or more different wavelengths, the wavelength may be selectively changed while maintaining the other variables (e.g., index of refraction, grating structure, etc.) to adjust the second far field beam steering direction 324 as desired.

Figure 5:
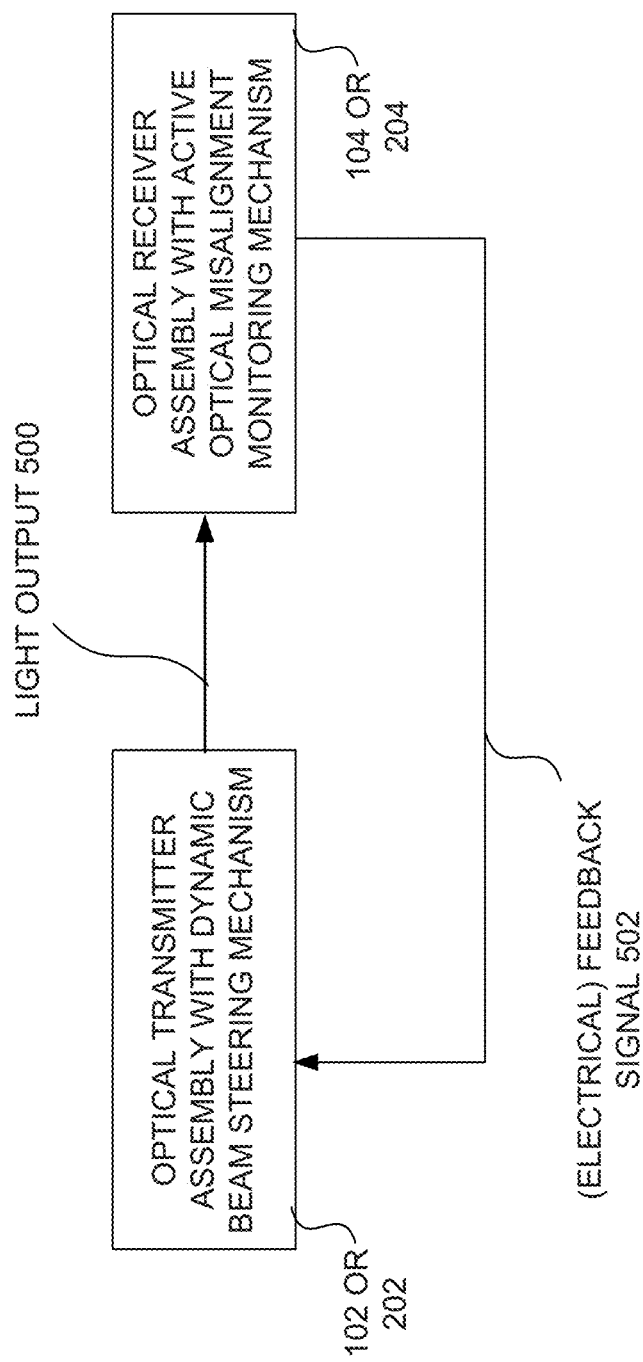
FIG. 5 depicts an example block diagram illustrating both optical and electrical communications between the optical transmitter and receiver assemblies included in the optoelectronic package of FIGS. 1 and 2, according to some embodiments.

In some embodiments, optoelectronic assembly 100 and 200 may include active optical misalignment monitoring capabilities as well as dynamic beam direction steering capabilities for the light output beam 322. FIG. 5 depicts an example block diagram illustrating both optical and electrical communications between the optical transmitter and receiver assemblies 102, 104 (or between assemblies 202, 204) associated with maintaining optical alignment. Light output 500 propagates along the optical pathway 146 (or 214/216/218) from the optical transmitter assembly 102 (or 202) to optical receiver assembly 104 (or 204). One or more feedback signals 502 may be generated and provided by the optical receiver assembly 104 (or 204) to the optical transmitter assembly 102 (or 202), thereby forming a feedback loop.

In some embodiments, feedback signals 502 may comprise electrical signals which are provided to the optical transmitter assembly 102 (or 202) via electrical pathways (e.g., electrical couplings between the optical transmitter and receiver assemblies 102, 104 (or 202, 204) via the package base 106 (or 206)). The electrical pathways in which the feedback signals 502 may travel may comprise non-high speed pathways or slower pathways relative to the optical pathways 146 or 214/216/218. The electrical pathways may comprise direct current (DC) pathways. In some embodiments, the pathway or mechanism by which the feedback signals 502 are provided from the optical receiver assembly 104 (or 204) to the optical transmitter assembly 102 (or 202) may operate at a slower transmission speed than the optical transmission speeds because, among other things, feedback signals 502 may be sent intermittently on an as-needed basis.

Figure 6A:
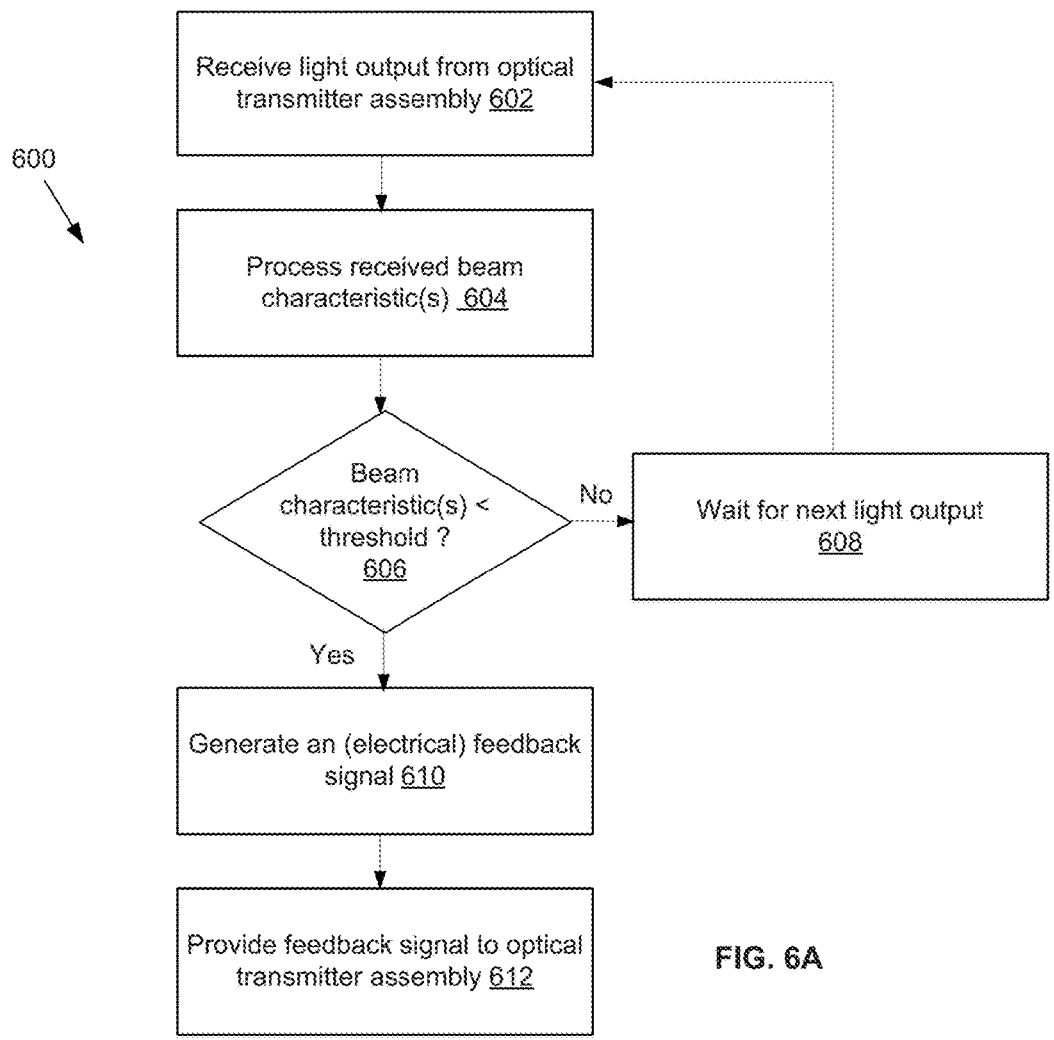
FIG. 6A depicts an example process for active monitoring of optical misalignment between the optical transmitter and receiver assemblies and facilitating re-alignment, according to some embodiments.
Figure 6B:
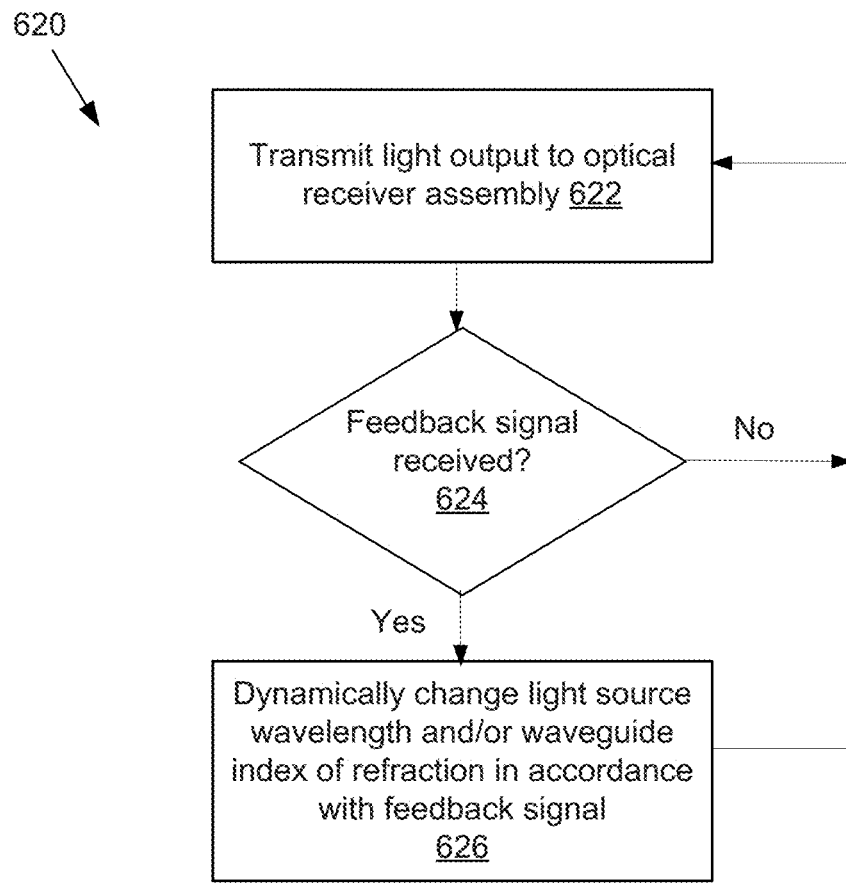
FIG. 6B depicts an example process for dynamically maintaining optical alignment between the optical transmitter and receiver assemblies, according to some embodiments.

FIG. 6A depicts an example process 600 for active monitoring of optical misalignment between the optical transmitter and receiver assemblies and facilitating re-alignment, according to some embodiments. FIG. 6B depicts an example process 620 for dynamically maintaining optical alignment between the optical transmitter and receiver assemblies, according to some embodiments.

At block 602 of FIG. 6A, the optical interface 144 (or 212) included in the optical receiver assembly 104 (or 204) may receive the light output 500 from the optical interface 124 (or 210) of the optical transmitter assembly 102 (or 202). Light output 500 may comprise the light output beam 322 outputted from optical transmitter assembly 102 (or 202) after propagating through the optical interface 124 (or 210). Light output 500 may impinge on a receiving area (also referred to as a target location) of the optical interface 144 (or 212) in accordance with the particular far field beam steering direction associated with the light output beam 322.

At least the optical interface 144 (or 212), optical interface 124 (or 210), and/or waveguide 208 may define a passively aligned optical path, which may be initially aligned to each other during the manufacturing process but then may be fixed during actual operation or use. Nevertheless, the dynamic adjustment possible in the far field beam steering direction of the light output beam 322 may permit adjustments in the particular direction in which the light output beam 322 enters the optical interface 124 (or 210) to compensate for possible misalignments, failures, or changes at one or more points in the passively aligned optical path. Accordingly, reliable and long-term optical connectivity or alignment within desirable tolerances between the optical transmitter and receiver assemblies 102, 104 (or 202, 204) may be realized.

Next at block 604, the optical receiver driver component 130, a processor in communication with the optical receiver assembly 104 (or 204), and/or other components capable of processing and/or obtaining one or more beam characteristics associated with the light output 500 received at the optical interface 144 (or 212) (hereinafter referred to as the received beam or received light) may obtain and/or process the received beam in preparation of analysis of the received beam's characteristic(s). For example, the power density of the received beam may be measured for analysis. The higher the power density, the better the optical alignment because the more of the light output 500 was received. Other beam characteristics and/or more than one beam characteristic may be obtained.

At block 606, the optical receiver driver component 130, a processor in communication with the optical receiver assembly 104 (or 204), and/or other component(s) included in the optoelectronic package 100 (or 200) may compare the beam characteristic(s) against one or more thresholds to determine whether the beam characteristic(s) satisfy pre-determined threshold(s). Continuing the example of power density, the measured power density may be compared against a threshold value, wherein the threshold value may comprise a pre-determined value indicative of a minimally acceptable optical alignment. For instance, the threshold value may be set to 95% of the power density associated with the light output 500.

If the beam characteristic(s) equal or exceed the threshold(s) (no branch of block 606), then the optical receiver assembly 104 (or 204) may wait for the next light output 500, at block 608. And the process 600 returns to block 602. If the beam characteristic(s) are less than the threshold(s) (yes branch of block 606), then process 600 proceeds to block 610. The optical misalignment may be of such an extent that an adjustment may be required.

In some embodiments, blocks 604 and 606 may be performed in real-time, near real-time, periodically, continuously, randomly, on an as-needed basis, or some other time basis. Likewise, if the light output 500 occurs in bursts as opposed to in a continuous time stream, then block 608 may comprise waiting for the next burst time period.

At block 610, the optical receiver driver component 130, a processor in communication with the optical receiver assembly 104 (or 204), and/or other component(s) included in the optoelectronic package 100 (or 200) may generate the feedback signal 502 based on the comparison performed in block 606. In some embodiments, the feedback signal 502 may comprise the power density measurement, an identifier indicative of the received light being below the threshold, light wavelength measurement, and/or other information about the received light.

The feedback signal 502 may then be provided to the optical transmitter assembly 102 (or 202) at block 612. As discussed above, the feedback signal 502 may be provided using electrical pathway(s) to the optical transmitter assembly 102 (or 202), for example, via package base 106 (or 206).

At block 622 in FIG. 6B, light output 500 may be transmitted from the optical interface 124 (or 210) included in the optical transmitter assembly 102 (or 202) to be received by the optical interface 144 (or 212) of the optical receiver assembly 104 (or 204). Next at block 624, the optical transmitter driver component 110, a processor in communication with the optical transmitter assembly 102 (or 202), and/or other component(s) included in the optoelectronic package 100 (or 200) may await or detect receipt of the feedback signal 502. In some embodiments, block 624 may be performed simultaneously with block 622.

If no feedback signal 502 is received (no branch of block 624), then process 620 returns to block 622 to continue transmission of the light output 500. Otherwise, a feedback signal 502 is received (yes branch of block 624), and process 620 proceeds to block 626.

At block 626, the optical transmitter driver component 110 may process the received feedback signal 502, as needed, and dynamically change/adjust one or both of the wavelength associated with the light source 302 and the refraction index associated with each waveguide of the plurality of waveguides 306 in accordance with the feedback signal 502. The dynamic adjustment to one or both of the wavelength and refraction indices may be performed to "steer" the light output beam 322 in a particular new far field beam steering direction—a new direction that may improve coupling into the optical interface 124 (or 210), which, in turn, may improve coupling of the light output 500 into the optical interface 144 (or 212) of the optical receiver assembly 104 (or 204). The wavelength and refraction indices may be changed as described above.

After the far field beam steering direction has been changed or "corrected" in block 626, process 620 proceeds to block 622 so that the next light output 500 may be transmitted in accordance with the particular new far field beam steering direction.

Processes 600 and 620 may be repeated on a continuous, periodic, or as needed basis to provide active monitoring and dynamic/active and high precision optical alignment between the optical transmitter and receiver assemblies 102, 104 (or 202, 204).

FIGS. 7A-7C depict additional details regarding the optical pathway between the optical transmitter and receiver assemblies 102, 104 (or 202, 204), according to some embodiments. In FIG. 7A, the light output beam 322 having a particular far field beam steering direction (e.g., generally in an upward vertical direction) may be "bent" within the optical interface 124 (or 210) to exit as the light output 500 along an optical path (e.g., generally in a rightward horizontal direction) aligned with the photodetector(s) included in the optical interface 144 (or 212). Such coupling may be referred to as a photodetector-based optical coupling. In FIG. 7B, the light output beam 322 having a particular far field beam steering direction (e.g., generally in an upward vertical direction) may be "bent" within the optical interface 124 (or 210) to exit as the light output 500 along an optical path (e.g., generally in a rightward horizontal direction) aligned with the fiber facet or coupler included in the optical interface 144 (or 212). Such coupling may be referred to as a fiber-based optical coupling. In FIG. 7C, the light output beam 322 having a particular far field beam steering direction (e.g., generally in an upward vertical direction) may be "bent" within the optical interface 124 (or 210) to exit as the light output 500 along an optical path (e.g., generally in a downward vertical direction) aligned with the receiving area of the waveguide 208 included in the package base 206. Such coupling may be referred to as a waveguide-based optical coupling. Light output 500 traverses the waveguide 208 and exits generally in an upward vertical direction to impinge on the optical interface 144 (or 212) (see FIG. 2).

Figure 8:
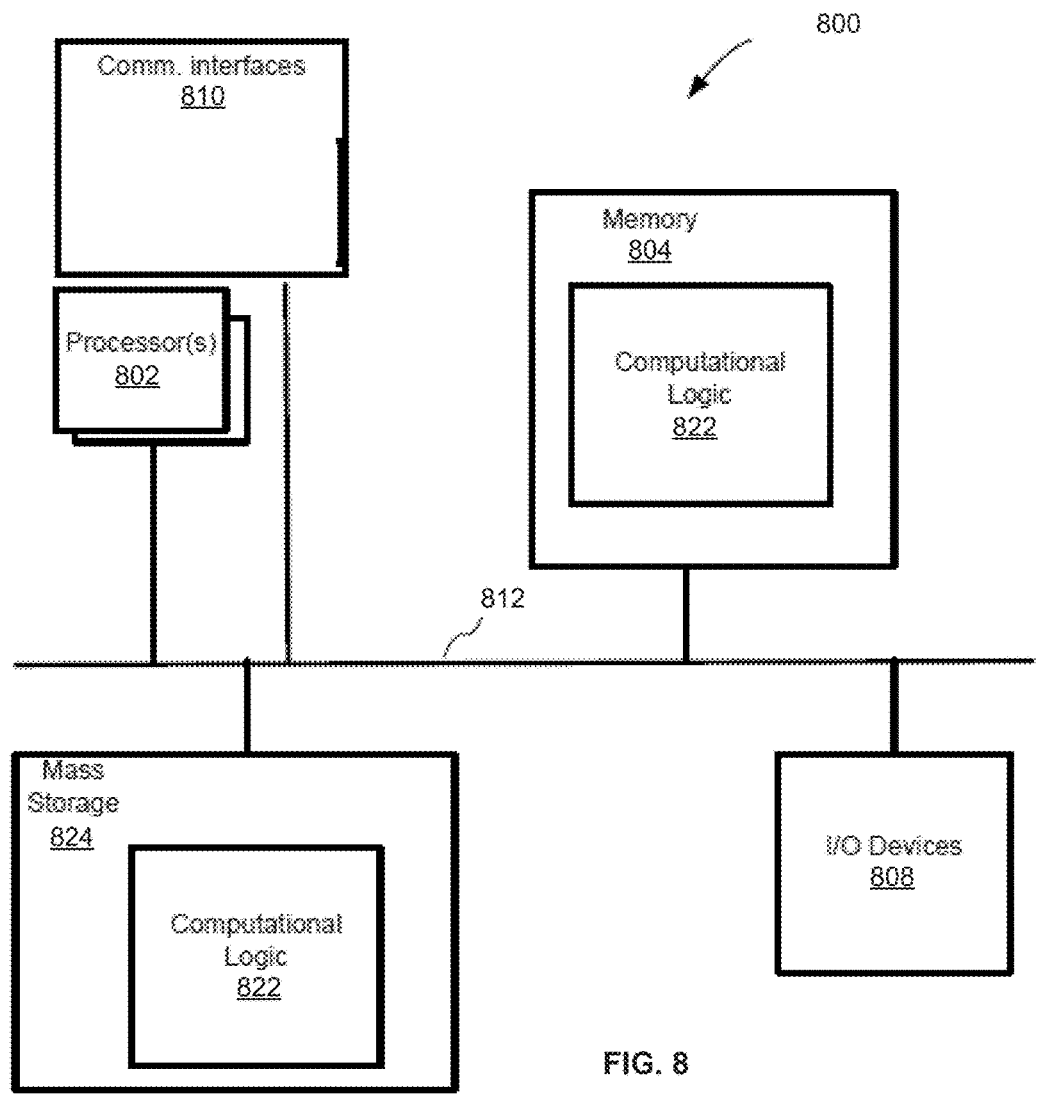
FIG. 8 illustrates an example computing device suitable for use with various components of FIGS. 1-7C, in accordance with some embodiments.

FIG. 8 illustrates an example computing device 800 suitable for use with various components of FIGS. 1-7C, in accordance with some embodiments. In some embodiments, example computing device 800 may include various components described in reference to FIGS. 1-7C.

As shown, computing device 800 may include one or more processors or processor cores 802 and system memory 804. For the purpose of the present disclosure, including the claims, the terms "processor" and "processor cores" may be considered synonymous, unless the context clearly requires otherwise. The processor 802 may include any type of processors, such as a central processing unit (CPU), a microprocessor, and the like. The processor 802 may be implemented as an integrated circuit having multi-cores, e.g., a multi-core microprocessor.

The computing device 800 may include mass storage devices 824 (such as solid state drives, volatile memory (e.g., dynamic random-access memory (DRAM), and so forth)). In general, system memory 804 and/or mass storage devices 824 may be temporal and/or persistent storage of any type, including, but not limited to, volatile and non-volatile memory, optical, magnetic, and/or solid state mass storage, and so forth. Volatile memory may include, but is not limited to, static and/or dynamic random-access memory. Non-volatile memory may include, but is not limited to, electrically erasable programmable read-only memory, phase change memory, resistive memory, and so forth.

The computing device 800 may further include input/output (I/O) devices 808 (such as a display, soft keyboard, touch sensitive screen, image capture device, and so forth) and communication interfaces 810 (such as network interface cards, modems, infrared receivers, radio receivers (e.g., Near Field Communication (NFC), Bluetooth, WiFi, 4G/5G Long Term Evolution (LTE), and so forth).

The communication interfaces 810 may include communication chips (not shown) that may be configured to operate the device 800 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 810 may operate in accordance with other wireless protocols in other embodiments.

In some embodiments, the communication interfaces 810 may include the optoelectronic package 100 or 200. Optoelectronic package 100 or 200 may, for example, enable communications between the processors 802 and other components of the computing device 800 or another (e.g., external) apparatus (not shown), via the I/O devices 808. In some embodiments, processors 802 may perform some or all of the processing, analysis, comparison, and/or generation of feedback and control signals described herein.

The above-described computing device 800 elements may be coupled to each other via system bus 812, which may represent one or more buses. In the case of multiple buses, they may be bridged by one or more bus bridges (not shown). Each of these elements may perform its conventional functions known in the art. In particular, system memory 804 and mass storage devices 824 may be employed to store a working copy and a permanent copy of the programming instructions implementing firmware, an operating system and/or one or more applications to be executed on computing device. Some of the firmware may configure, control and/or operate the integrated circuits associated with the IC assembly described in reference to FIGS. 1-7C, collectively denoted as computational logic 822. Computational logic 822 may be implemented in assembler instructions supported by processor(s) 802 or high-level languages that may be compiled into such instructions.

The number, capability, and/or capacity of the elements 808, 810, 812 may vary, depending on whether computing device 800 is used as a mobile computing device, such as a tablet computing device, laptop computer, game console, or smartphone, or a stationary computing device, such as a set-top box or desktop computer. Their constitutions are otherwise known, and accordingly will not be further described.

At least one of processors 802 may be packaged together with memory having computational logic 822 to form a System in Package (SiP) or a System on Chip (SoC). In various implementations, the computing device 800 may comprise a mobile computing device, such as a smartphone, a tablet, a personal digital assistant (PDA), an ultra mobile PC, or any other mobile computing device. In various embodiments, the computing device may comprise a laptop, a netbook, a notebook, or an ultrabook. In further implementations, the computing device 800 may be any other electronic device that processes data.

In some embodiments, whole or portion of the optoelectronic package 100 or 200 may be included in any of components 802, 810, 804, 822, 812, 824, 822, and/or 808. In some embodiments, a portion of the optoelectronic package 100 or 200 (e.g., optical transmitter assembly 102 or 202) may be included in a first device and another portion of the optoelectronic package 100 or 200 (e.g., optical receiver assembly 202 or 204) may be included in a second device.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Illustrative examples of the devices, systems, and methods of various embodiments disclosed herein are provided below. An embodiment of the devices, systems, and methods may include any one or more, and any combination of, the examples described below.

Example 1 is an integrated circuit (IC) optical assembly including a transmitter component to provide light output having a particular beam direction, the transmitter component including a light source optically coupled to a plurality of waveguides, a waveguide of the plurality of waveguides optically coupled to a respective grating of a plurality of gratings, and a phase tuner of a plurality of phase tuners coupled to a respective waveguide of the plurality of waveguides; and a transmitter driver component electrically coupled to the transmitter component, the transmitter driver component to cause, in accordance with a feedback signal, a light provided by the light source to be centered at a particular wavelength and a particular phase to be induced by each phase tuner of the plurality of phase tuners on the respective waveguide of the plurality of waveguides to generate the light output having the particular beam direction.

Example 2 may include the subject matter of Example 1, and may further include wherein the plurality of phase tuners induce the particular phase for the respective waveguide of the plurality of waveguides by causing a particular change to an index of refraction associated with at least a portion of the respective waveguide.

Example 3 may include the subject matter of any of Examples 1-2, and may further include wherein the transmitter component further includes an insulator layer provided above the light source, the plurality of waveguides, and the plurality of gratings; a substrate provided above the insulator layer; and a reflective layer provided below the plurality of gratings; wherein the light provided by the light source is caused to propagate within each waveguide of the plurality of waveguides in accordance with the particular phase induced by the phase tuner in each of the respective waveguides, wherein phased light outputted from respective waveguides of the plurality of waveguides are combined by the plurality of gratings to generate the light output, and wherein the light output is reflected by the reflective layer to be emitted from a side of the substrate that is furthest from the light source.

Example 4 may include the subject matter of any of Examples 1-3, and may further include wherein the transmitter component further includes an optical modulator provided between the light source and the plurality of waveguides, and wherein the substrate includes silicon, the insulator layer includes silicon dioxide, each of the plurality of waveguides and the plurality of gratings includes silicon, and the optical modulator includes doped silicon.

Example 5 may include the subject matter of any of Examples 1-4, and may further include a receiver component having a light receiving area, wherein the light output is caused to impinge the light receiving area.

Example 6 may include the subject matter of any of Examples 1-5, and may further include a receiver driver component electrically coupled to the receiver component; wherein the receiver driver component is to compare at least one characteristic of the light impinging on the light receiving area against a threshold, and to provide the feedback signal to the transmitter driver component when the characteristic does not satisfy the threshold, wherein the transmitter driver component is to cause one or both of the particular wavelength or the particular phase to change in accordance with the feedback signal to change the particular beam direction.

Example 7 may include the subject matter of any of Examples 1-6, and may further include wherein the light receiving area includes one or more photodetectors.

Example 8 may include the subject matter of any of Examples 1-7, and may further include wherein the light receiving area includes an optical fiber coupler.

Example 9 may include the subject matter of any of Examples 1-8, and may further include a printed circuit board (PCB) coupled to each of the transmitter component and the receiver component, wherein the PCB includes a polymer waveguide, and wherein the light output propagates within the polymer waveguide and the polymer waveguide is to cause the light output to impinge on the light receiving area.

Example 10 may include the subject matter of any of Examples 1-9, and may further include one or more optical interfaces in an optical path between the transmitter component and the light receiving area of the receiver component, wherein the particular beam direction is selected to cause the light output to impinge on the light receiving area.

Example 11 may include the subject matter of any of Examples 1-10, and may further include wherein the transmitter component and the receiver component are included in a single package.

Example 12 may include the subject matter of any of Examples 1-11, and may further include wherein the light source includes a Group III-V tunable laser and the particular wavelength is tunable in a wavelength range from approximately 1200 to 1600 nanometer (nm).

Example 13 may include the subject matter of any of Examples 1-12, and may further include wherein the plurality of waveguides include eight to 64 waveguides.

Example 14 may include the subject matter of any of Examples 1-13, and may further include wherein each phase tuner of the plurality of phase tuners includes an electrode, a heater, or a waveguide temperature controller.

Example 15 may include the subject matter of any of Examples 1-14, and may further include wherein each phase tuner of the plurality of phase tuners includes a waveguide doping concentration controller.

Example 16 may include the subject matter of any of Examples 1-15, and may further include wherein the particular beam direction is any direction in three-dimensional space.

Example 17 is an apparatus including a processor; and an optoelectronic assembly electrically coupled to the processor, the optoelectronic assembly including a transmitter component electrically coupled to a transmitter driver component, and the transmitter component is to provide light output having a particular beam direction, wherein the transmitter component includes a light source optically coupled to a plurality of waveguides, a waveguide of the plurality of waveguides optically coupled to a respective grating of a plurality of gratings, and a phase tuner of a plurality of phase tuners coupled to a respective waveguide of the plurality of waveguides, and wherein the transmitter driver component causes, in accordance with a feedback signal, a light provided by the light source to be centered at a particular wavelength and a particular phase to be induced by each phase tuner of the plurality of phase tuners on the respective waveguide of the plurality of waveguides to generate the light output having the particular beam direction.

Example 18 may include the subject matter of Example 17, and may further include wherein the plurality of phase tuners induce the particular phase for the respective waveguide of the plurality of waveguides by causing a particular change to an index of refraction associated with at least a portion of the respective waveguide.

Example 19 may include the subject matter of any of Examples 17-18, and may further include wherein the transmitter component further includes an insulator layer provided above the light source, the plurality of waveguides, and the plurality of gratings; a substrate provided above the insulator layer; and a reflective layer provided below the plurality of gratings; wherein the light provided by the light source is caused to propagate within each waveguide of the plurality of waveguides in accordance with the particular phase induced by the phase tuner in each of the respective waveguides, wherein phased light outputted from respective waveguides of the plurality of waveguides are combined by the plurality of gratings to generate the light output, and wherein the light output is reflected by the reflective layer to be emitted from a side of the substrate that is furthest from the light source.

Example 20 may include the subject matter of any of Examples 17-19, and may further include wherein the transmitter component further includes an optical modulator provided between the light source and the plurality of waveguides, and wherein the substrate includes silicon, the insulator layer includes silicon dioxide, each of the plurality of waveguides and the plurality of gratings includes silicon, and the optical modulator includes doped silicon.

Example 21 may include the subject matter of any of Examples 17-20, and may further include a receiver component having a light receiving area, wherein the light output is caused to impinge the light receiving area.

Example 22 may include the subject matter of any of Examples 17-21, and may further include a receiver driver component electrically coupled to the receiver component; wherein the receiver driver component is to compare at least one characteristic of the light impinging on the light receiving area against a threshold, and to provide the feedback signal to the transmitter driver component when the characteristic does not satisfy the threshold, wherein the transmitter driver component is to cause one or both of the particular wavelength or the particular phase to change in accordance with the feedback signal to change the particular beam direction.

Example 23 may include the subject matter of any of Examples 17-22, and may further include wherein the transmitter component and the receiver component are included in a single package.

Example 24 may include the subject matter of any of Examples 17-23, and may further include wherein the light source includes a Group III-V tunable laser and the particular wavelength is tunable in a wavelength range from approximately 1200 to 1600 nanometer (nm).

Example 25 is a method including transmitting a light beam having a first beam direction, wherein the first beam direction is associated with a first wavelength of a light source and a first plurality of refraction indices associated with a plurality of waveguides; receiving a signal indicative of an extent of receipt of the light beam at a receiving area, wherein the signal is caused to be generated when the extent of receipt of the light beam is less than a threshold; changing one or both of the first wavelength to a second wavelength for the light source and the first plurality of refraction indices to a second plurality of refraction indices for the plurality of waveguides in accordance with the signal; and transmitting the light beam having a second beam direction, wherein the second beam direction is associated with one or both of the second wavelength and the second plurality of refraction indices.

Example 26 may include the subject matter of Example 25, and may further include wherein receiving the signal includes receiving the signal using an electrical coupling between a first assembly including the light source and a second assembly including the receiving area.

Example 27 may include the subject matter of any of Examples 25-26, and may further include wherein changing one or both of the first wavelength and the first plurality of refraction indices includes tuning the light source from the first wavelength to the second wavelength.

Example 28 may include the subject matter of any of Examples 25-27, and may further include wherein changing one or both of the first wavelength and the first plurality of refraction indices includes inducing a phase delay associated with a respective waveguide of the plurality of waveguides, wherein the phase delay associated with each waveguide of the plurality of waveguides is different from each other.

Example 29 may include the subject matter of any of Examples 25-28, and may further include wherein the first wavelength or the second wavelength is an infrared wavelength.

Example 30 is an apparatus including means for transmitting a light beam having a first beam direction, wherein the first beam direction is associated with a first wavelength of a light source and a first plurality of refraction indices associated with a plurality of waveguides; means for receiving a signal indicative of an extent of receipt of the light beam at a receiving area, wherein the signal is caused to be generated when the extent of receipt of the light beam is less than a threshold; means for changing one or both of the first wavelength to a second wavelength for the light source and the first plurality of refraction indices to a second plurality of refraction indices for the plurality of waveguides in accordance with the signal; and means for transmitting the light beam having a second beam direction, wherein the second beam direction is associated with one or both of the second wavelength and the second plurality of refraction indices.

Example 31 may include the subject matter of Example 30, and may further include wherein the means for receiving the signal includes an electrical connection between a first assembly including the light source and a second assembly including the receiving area.

Example 32 may include the subject matter of any of Examples 30-31, and may further include wherein the means for changing one or both of the first wavelength and the first plurality of refraction indices includes a Group III-V tunable laser having a center wavelength of approximately 1200 to 1600 nanometer (nm).

Example 33 may include the subject matter of any of Examples 30-32, and may further include wherein the means for changing one or both of the first wavelength and the first plurality of refraction indices includes means for inducing a phase delay associated with a respective waveguide of the plurality of waveguides, wherein the phase delay associated with each waveguide of the plurality of waveguides is different from each other.

Example 34 may include the subject matter of any of Examples 30-33, and may further include wherein the means for inducing the phase delay includes an electrode, a heater, a temperature controller, a doping concentration controller, or a phase tuner.

Example 35 may include the subject matter of any of Examples 30-34, and may further include wherein the means for transmitting the light beam includes the light source optically coupled to an optical modulator, the optical modulator optically coupled to the plurality of waveguides, a waveguide of the plurality of waveguides optically coupled to a respective grating of a plurality of gratings, and a phase tuner of a plurality of phase tuners coupled to a respective waveguide of the plurality of waveguides.

Example 36 is one or more computer-readable storage medium comprising a plurality of instructions to cause an apparatus, in response to execution by one or more processors of the apparatus, to transmit a light beam having a first beam direction, wherein the first beam direction is associated with a first wavelength of a light source and a first plurality of refraction indices associated with a plurality of waveguides; receive a signal indicative of an extent of receipt of the light beam at a receiving area, wherein the signal is caused to be generated when the extent of receipt of the light beam is less than a threshold; change one or both of the first wavelength to a second wavelength for the light source and the first plurality of refraction indices to a second plurality of refraction indices for the plurality of waveguides in accordance with the signal; and transmit the light beam having a second beam direction, wherein the second beam direction is associated with one or both of the second wavelength and the second plurality of refraction indices.

Example 37 may include the subject matter of Example 36, and may further include wherein to receive the signal includes to receive the signal using an electrical coupling between a first assembly including the light source and a second assembly including the receiving area.

Example 38 may include the subject matter or any of Examples 36-37, and may further include wherein to change one or both of the first wavelength and the first plurality of refraction indices includes to tune the light source from the first wavelength to the second wavelength.

Example 39 may include the subject matter or any of Examples 36-38, and may further include wherein to change one or both of the first wavelength and the first plurality of refraction indices includes to induce a phase delay associated with a respective waveguide of the plurality of waveguides, wherein the phase delay associated with each waveguide of the plurality of waveguides is different from each other.

Example 40 may include the subject matter or any of Examples 36-39, and may further include wherein the first wavelength or the second wavelength is an infrared wavelength.

Example 41 is an optoelectronic package including a transmitter component having a light output at a particular beam direction, the transmitter component including a light source and a plurality of waveguides, wherein the particular beam direction is defined by a wavelength associated with the light source and a phase associated with a respective waveguide of the plurality of waveguides; a transmitter driver component electrically coupled to the transmitter component; a receiver component; an optical interface between the transmitter component and the receiver component, the light output from the transmitter component to be received by the optical interface and to be outputted to the receiver component by the optical interface; and a receiver driver component electrically coupled to the receiver component, the receiver driver component to provide a feedback signal to the transmitter driver component when a light input, which is associated with the light output, is received at the receiver component and does not satisfy a threshold.

Example 42 may include the subject matter of Example 41, and may further include wherein the transmitter driver component is to cause one or both of the wavelength associated with the light source to change and the phase associated with the respective waveguide of the plurality of waveguides to change, in response to the feedback signal, to cause the particular beam direction to change.

Example 43 may include the subject matter of any of Examples 41-42, and may further include wherein the optical interface includes a first optical interface proximate to the transmitter component and a second optical interface proximate to the receiver component.

Example 44 may include the subject matter of any of Examples 41-43, and may further include wherein the threshold comprises a power density value, and wherein the feedback signal is indicative of a characteristic associated with the light input.

Example 45 may include the subject matter of any of Examples 41-44, and may further include wherein the transmitter component includes: the light source optically coupled to the plurality of waveguides; a waveguide of the plurality of waveguides optically coupled to a respective grating of a plurality of gratings; a phase tuner of a plurality of phase tuners coupled to the respective waveguide of the plurality of waveguides; an insulator layer provided above the light source, the plurality of waveguides, and the plurality of gratings; a substrate provided above the insulator layer; and a reflective layer provided below the plurality of gratings; wherein a light provided by the light source at the wavelength is caused to propagate within each waveguide of the plurality of waveguides in accordance with the phase induced by the phase tuner in each of the respective waveguides, wherein phased light outputted from respective waveguides of the plurality of waveguides are combined by the plurality of gratings to generate the light output, and wherein the light output is reflected by the reflective layer to be emitted from a side of the substrate that is furthest from the light source.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

We claim:

1. An integrated circuit (IC) optical assembly comprising:
    a transmitter component to provide light output having a particular beam direction, the transmitter component including a light source optically coupled to a plurality of waveguides, a waveguide of the plurality of waveguides optically coupled to a respective grating of a plurality of gratings, and a phase tuner of a plurality of phase tuners coupled to a respective waveguide of the plurality of waveguides; and
    a transmitter driver component electrically coupled to the transmitter component, the transmitter driver component to cause, in accordance with a feedback signal, a light provided by the light source to be centered at a particular wavelength and a particular phase to be induced by each phase tuner of the plurality of phase tuners on the respective waveguide of the plurality of waveguides to generate the light output having the particular beam direction.

2. The IC optical assembly of claim 1, wherein the plurality of phase tuners induce the particular phase for the respective waveguide of the plurality of waveguides by causing a particular change to an index of refraction associated with at least a portion of the respective waveguide.

3. The IC optical assembly of claim 1, wherein the transmitter component further includes:
    an insulator layer provided above the light source, the plurality of waveguides, and the plurality of gratings;
    a substrate provided above the insulator layer; and
    a reflective layer provided below the plurality of gratings;
    wherein the light provided by the light source is caused to propagate within each waveguide of the plurality of waveguides in accordance with the particular phase induced by the phase tuner in each of the respective waveguides, wherein phased light outputted from respective waveguides of the plurality of waveguides are combined by the plurality of gratings to generate the light output, and wherein the light output is reflected by the reflective layer to be emitted from a side of the substrate that is furthest from the light source.

4. The IC optical assembly of claim 3, wherein the transmitter component further includes an optical modulator provided between the light source and the plurality of waveguides, and wherein the substrate includes silicon, the insulator layer includes silicon dioxide, each of the plurality of waveguides and the plurality of gratings includes silicon, and the optical modulator includes doped silicon.

5. The IC optical assembly of claim 1, further comprising a receiver component having a light receiving area, wherein the light output is caused to impinge the light receiving area.

6. The IC optical assembly of claim 5, further including:
    a receiver driver component electrically coupled to the receiver component;
    wherein the receiver driver component is to compare at least one characteristic of the light impinging on the light receiving area against a threshold, and to provide the feedback signal to the transmitter driver component when the characteristic does not satisfy the threshold, wherein the transmitter driver component is to cause one or both of the particular wavelength or the particular phase to change in accordance with the feedback signal to change the particular beam direction.

7. The IC optical assembly of claim 5, wherein the light receiving area includes one or more photodetectors.

8. The IC optical assembly of claim 5, wherein the light receiving area includes an optical fiber coupler.

9. The IC optical assembly of claim 5, further comprising a printed circuit board (PCB) coupled to each of the transmitter component and the receiver component, wherein the PCB includes a polymer waveguide, and wherein the light output propagates within the polymer waveguide and the polymer waveguide is to cause the light output to impinge on the light receiving area.

10. The IC optical assembly of claim 5, wherein the transmitter component and the receiver component are included in a single package.

11. The IC optical assembly of claim 1, wherein the light source includes a Group III-V tunable laser and the particular wavelength is tunable in a wavelength range from approximately 1200 to 1600 nanometer (nm).

12. The IC optical assembly of claim 1, wherein the particular beam direction is any direction in three-dimensional space.

13. An apparatus comprising:
a processor; and
an optoelectronic assembly electrically coupled to the processor, the optoelectronic assembly including a transmitter component electrically coupled to a transmitter driver component, and the transmitter component is to provide light output having a particular beam direction, wherein the transmitter component includes a light source optically coupled to a plurality of waveguides, a waveguide of the plurality of waveguides optically coupled to a respective grating of a plurality of gratings, and a phase tuner of a plurality of phase tuners coupled to a respective waveguide of the plurality of waveguides, and wherein the transmitter driver component causes, in accordance with a feedback signal, a light provided by the light source to be centered at a particular wavelength and a particular phase to be induced by each phase tuner of the plurality of phase tuners on the respective waveguide of the plurality of waveguides to generate the light output having the particular beam direction.

14. The apparatus of claim 13, wherein the plurality of phase tuners induce the particular phase for the respective waveguide of the plurality of waveguides by causing a particular change to an index of refraction associated with at least a portion of the respective waveguide.

15. The apparatus of claim 13, wherein the transmitter component further includes:
an insulator layer provided above the light source, the plurality of waveguides, and the plurality of gratings;
a substrate provided above the insulator layer; and
a reflective layer provided below the plurality of gratings;
wherein the light provided by the light source is caused to propagate within each waveguide of the plurality of waveguides in accordance with the particular phase induced by the phase tuner in each of the respective waveguides, wherein phased light outputted from respective waveguides of the plurality of waveguides are combined by the plurality of gratings to generate the light output, and wherein the light output is reflected by the reflective layer to be emitted from a side of the substrate that is furthest from the light source.

16. The apparatus of claim 13, further comprising a receiver component having a light receiving area, wherein the light output is caused to impinge the light receiving area.

17. The apparatus of claim 16, further including:
a receiver driver component electrically coupled to the receiver component;
wherein the receiver driver component is to compare at least one characteristic of the light impinging on the light receiving area against a threshold, and to provide the feedback signal to the transmitter driver component when the characteristic does not satisfy the threshold,
wherein the transmitter driver component is to cause one or both of the particular wavelength or the particular phase to change in accordance with the feedback signal to change the particular beam direction.

18. A method comprising:
transmitting a light beam having a first beam direction, wherein the first beam direction is associated with a first wavelength of a light source and a first plurality of refraction indices associated with a plurality of waveguides;
receiving a signal indicative of an extent of receipt of the light beam at a receiving area, wherein the signal is caused to be generated when the extent of receipt of the light beam is less than a threshold;
changing one or both of the first wavelength to a second wavelength for the light source and the first plurality of refraction indices to a second plurality of refraction indices for the plurality of waveguides in accordance with the signal; and
transmitting the light beam having a second beam direction, wherein the second beam direction is associated with one or both of the second wavelength and the second plurality of refraction indices.

19. The method of claim 18, wherein receiving the signal includes receiving the signal using an electrical coupling between a first assembly including the light source and a second assembly including the receiving area.

20. The method of claim 18, wherein changing one or both of the first wavelength and the first plurality of refraction indices includes inducing a phase delay associated with a respective waveguide of the plurality of waveguides, wherein the phase delay associated with each waveguide of the plurality of waveguides is different from each other.

* * * * *